(12) United States Patent
Oiwane

(10) Patent No.: US 11,978,972 B2
(45) Date of Patent: May 7, 2024

(54) ELECTRICAL CONNECTOR AND METHOD OF INSPECTING THE ELECTRICAL CONNECTOR

(71) Applicant: Murata Manufacturing Co., Ltd., Kyoto-fu (JP)

(72) Inventor: Toshimichi Oiwane, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 230 days.

(21) Appl. No.: 17/389,846

(22) Filed: Jul. 30, 2021

(65) Prior Publication Data

US 2021/0359439 A1    Nov. 18, 2021

Related U.S. Application Data

(63) Continuation of application No. PCT/JP2020/004584, filed on Feb. 6, 2020.

(30) Foreign Application Priority Data

Feb. 7, 2019    (JP) ................................. 2019-020664

(51) Int. Cl.
*H01R 12/71* (2011.01)
*G01R 31/68* (2020.01)
(Continued)

(52) U.S. Cl.
CPC ............ *H01R 12/71* (2013.01); *G01R 31/68* (2020.01); *H01R 12/716* (2013.01); *H01R 12/73* (2013.01);
(Continued)

(58) Field of Classification Search
CPC ...... H01R 12/71; H01R 12/716; H01R 12/73; H01R 13/652; H01R 13/6581;
(Continued)

(56) References Cited

U.S. PATENT DOCUMENTS

2015/0207248 A1*  7/2015  Takenaga ............. H01R 12/716
                                                                     439/74

FOREIGN PATENT DOCUMENTS

CN        2731782 Y      10/2005
CN     104733897 A  *   6/2015
(Continued)

OTHER PUBLICATIONS

International Search Report issued in PCT/JP2020/004584; dated Mar. 17, 2020.
(Continued)

*Primary Examiner* — Abdullah A Riyami
*Assistant Examiner* — Justin M Kratt
(74) *Attorney, Agent, or Firm* — Studebaker & Brackett PC

(57) ABSTRACT

An electrical connector is capable of performing stable inspection without affecting an extraction force of a connector engagement portion. The electrical connector includes a housing having an electrical insulation property, an internal terminal held by the housing, and an external terminal held by the housing, with the external terminal to be electrically connected to a ground. The external terminal includes a fitting portion having a first engagement wall portion at one side and having a second engagement wall portion at the other side in a plan view from a connector insertion/extraction direction. A first engagement portion is formed at the first engagement wall portion, and a second engagement portion is formed at the second engagement wall portion.

17 Claims, 10 Drawing Sheets

(51) Int. Cl.
*H01R 12/73* (2011.01)
*H01R 13/652* (2006.01)
*H01R 13/6581* (2011.01)
*H01R 13/6591* (2011.01)
*G01R 31/66* (2020.01)
*G01R 31/70* (2020.01)
*H01R 13/20* (2006.01)
*H01R 13/648* (2006.01)

(52) U.S. Cl.
CPC ....... *H01R 13/652* (2013.01); *H01R 13/6581* (2013.01); *H01R 13/6591* (2013.01); *G01R 31/66* (2020.01); *G01R 31/70* (2020.01); *H01R 12/712* (2013.01); *H01R 13/20* (2013.01); *H01R 13/648* (2013.01)

(58) Field of Classification Search
CPC .. H01R 13/6591; H01R 12/712; H01R 13/20; H01R 13/648; G01R 31/68; G01R 31/66; G01R 31/70
See application file for complete search history.

(56) References Cited

FOREIGN PATENT DOCUMENTS

| | | |
|---|---|---|
| JP | 2001-006818 A | 1/2001 |
| JP | 2006-100240 A | 4/2006 |
| JP | 2010-157368 A | 7/2010 |
| JP | 2014-212040 A | 11/2014 |
| JP | 2014212040 A * | 11/2014 |
| JP | 2017-033909 A | 2/2017 |
| JP | 2018-116925 A | 7/2018 |
| WO | 2018/025873 A1 | 2/2018 |

OTHER PUBLICATIONS

Written Opinion of the International Searching Authority issued in PCT/JP2020/004584; dated Mar. 17, 2020.

* cited by examiner

ELECTRICAL CONNECTOR AND METHOD OF INSPECTING THE ELECTRICAL CONNECTOR

CROSS-REFERENCE TO RELATED APPLICATIONS

This application claims benefit of priority to International Patent Application No. PCT/JP2020/004584, filed Feb. 6, 2020, and to Japanese Patent Application No. 2019-020664, filed Feb. 7, 2019, the entire contents of each are incorporated herein by reference.

BACKGROUND

Technical Field

The present disclosure relates to an electrical connector and a method of inspecting the electrical connector.

Background Art

An electrical connector set is configured such that a first connector and a second connector are fitted with each other as described, for example, in Japanese Unexamined Patent Application Publication No. 2018-116925.

In an electrical connector set of Japanese Unexamined Patent Application Publication No. 2018-116925, a first connector engagement portion provided at a first external terminal of a first connector and a second connector engagement portion provided at a second external terminal of a second connector are engaged with each other. Thus, the second connector is fitted to the first connector, and the second connector is prevented from being accidentally detached from the first connector.

SUMMARY

When an electrical connector is inspected by using an inspection device, for example, the electrical connector and the inspection device may not be fitted to each other. In this case, a probe of the inspection device cannot stably come into contact with an internal terminal of the electrical connector, and thus, variations in inspection result increase.

Additionally, when the electrical connector is inspected by using the inspection device, an engagement member for inspection of the inspection device may be provided with an engagement portion for inspection, and the engagement portion for inspection may be engaged with a connector engagement portion (the first connector engagement portion or the second connector engagement portion). At this time, depending on an inspection process, there is a possibility that wear or deformation of the connector engagement portion occurs, and thus, an extraction force of the connector engagement portion may deteriorate.

Thus, the present disclosure provides an electrical connector and a method of inspecting the electrical connector that are capable of performing a stable inspection without affecting an extraction force of a connector engagement portion.

An electrical connector according to the present disclosure includes an electrical connector including a housing having an electrical insulation property, an internal terminal held by the housing, and an external terminal held by the housing, the external terminal to be electrically connected to a ground. The external terminal includes a fitting portion having a first engagement wall portion at one side and having an engagement wall portion for inspection at the other side in a plan view from a connector insertion/extraction direction. A first engagement portion is formed at the first engagement wall portion, and a second engagement portion is formed at the second engagement wall portion.

According to the electrical connector of the present disclosure, since the first engagement portion and the second engagement portion are respectively separately formed at the one side and the other side of the fitting portion, an extraction force of the first engagement portion is not affected, and stable inspection can be performed.

DETAILED DESCRIPTION

Hereinafter, an electrical connector according to the present disclosure will be described with reference to the drawings, and first, an electrical connector set 1 including a first connector 2 and a second connector 4 as electrical connectors will be described. Note that, in each figure, an X-axis, a Y-axis, and a Z-axis that are orthogonal to each other are illustrated for convenience.

[Electrical Connector Set]

Figure 1:
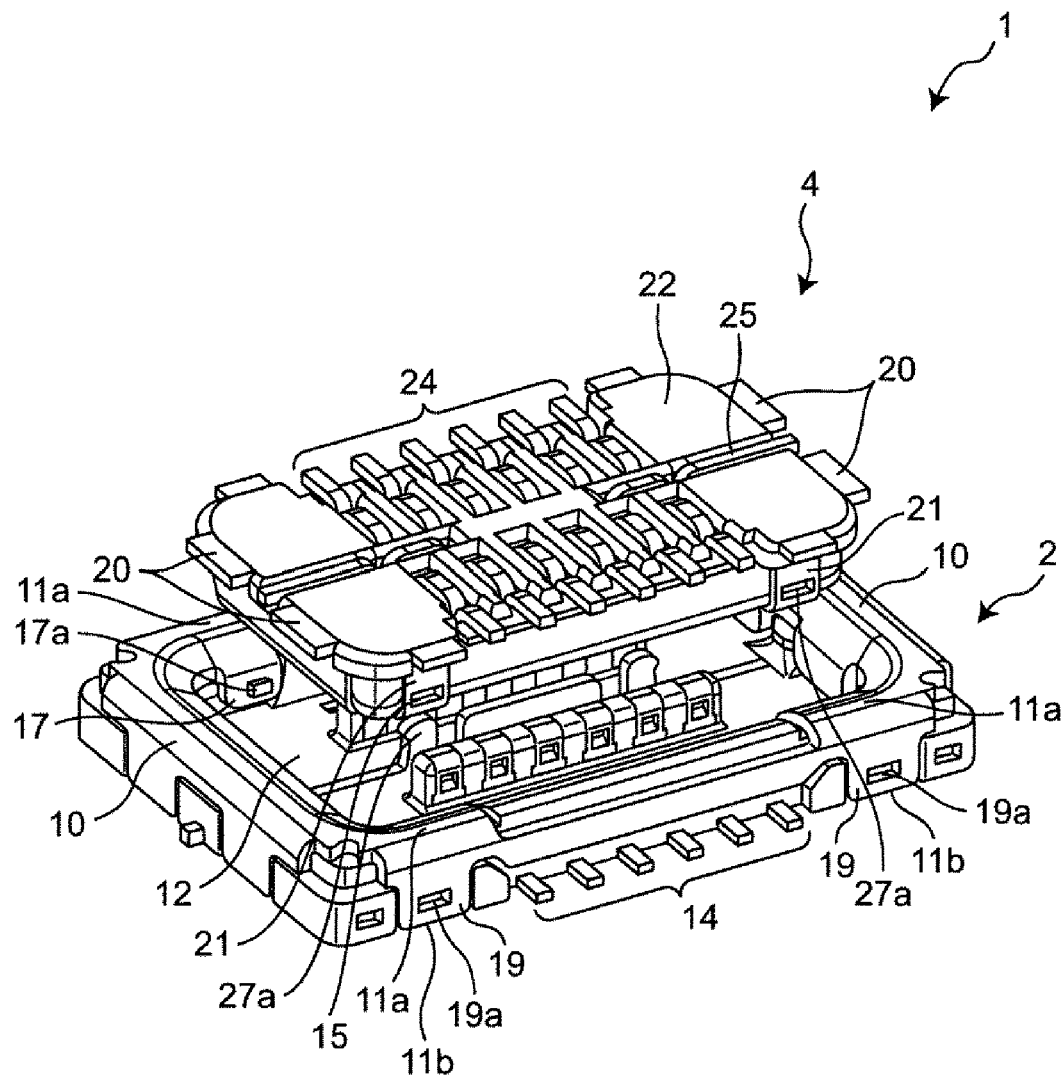
FIG. 1 is an exploded perspective view of an electrical connector set according to an embodiment.
Figure 2:
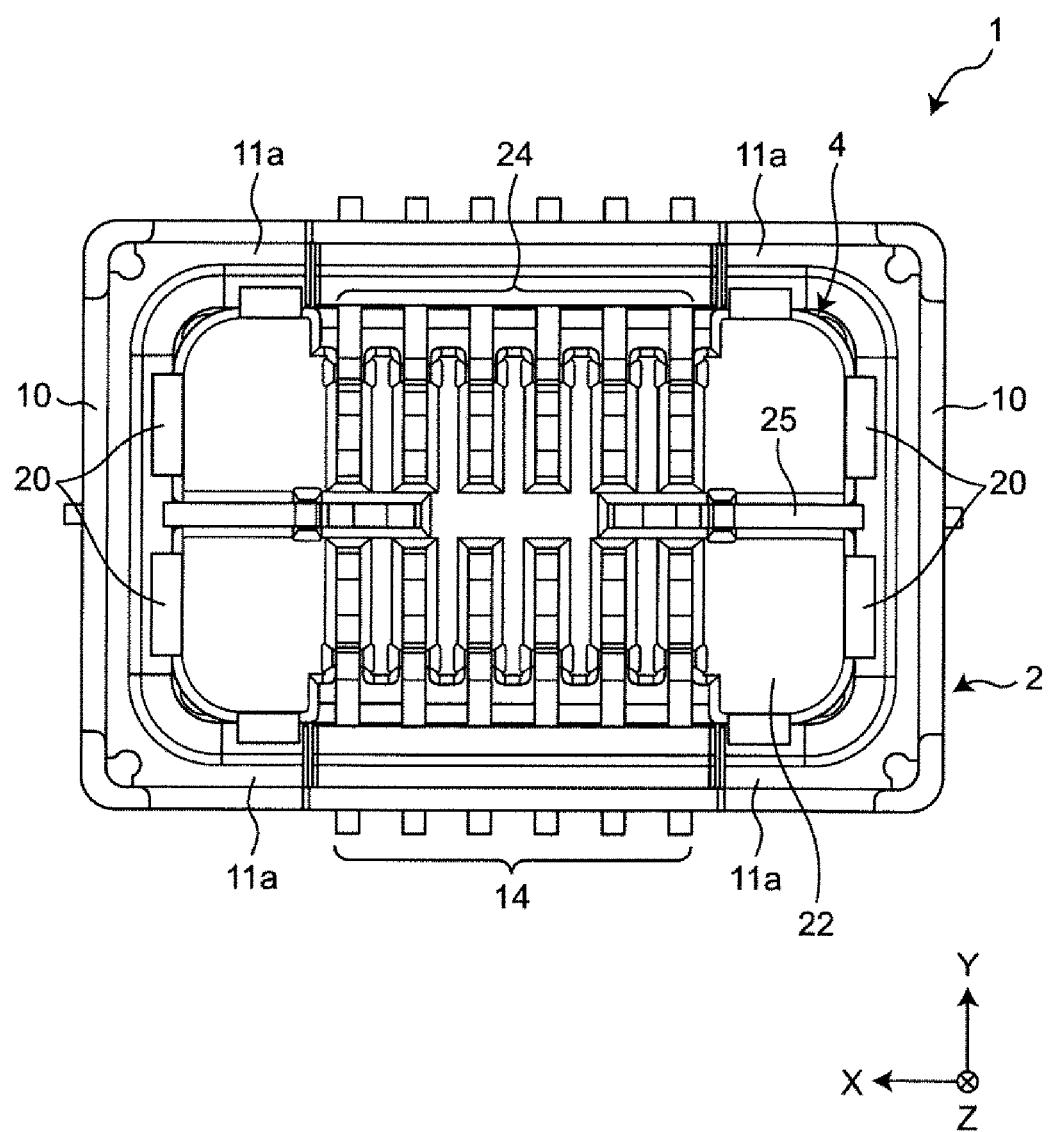
FIG. 2 is a plan view of the electrical connector set illustrated in FIG. 1.

FIG. 1 is an exploded perspective view of the electrical connector set 1 according to the embodiment. FIG. 2 is a plan view of the electrical connector set 1 illustrated in FIG. 1.

As illustrated in FIG. 1 and FIG. 2, the electrical connector set 1 includes the first connector 2 and the second connector 4 serving as a fitting counterpart to the first connector 2. The first connector 2 is configured to be fitted to the second connector 4 such that the first connector 2 can be inserted into and extracted from the second connector 4 in a connector insertion/extraction direction (Z-axis direction). As illustrated in FIG. 1, the electrical connector set 1 is configured such that the first connector 2 and the second connector 4 are fitted to each other by moving the second connector 4 toward the first connector 2 (in a connector insertion direction) in a state in which the second connector 4 faces the first connector 2. The first connector 2 and the second connector 4 are mounted on separate circuit boards (not illustrated), and are electrically connected to each other.

[First Connector]

Figure 3:
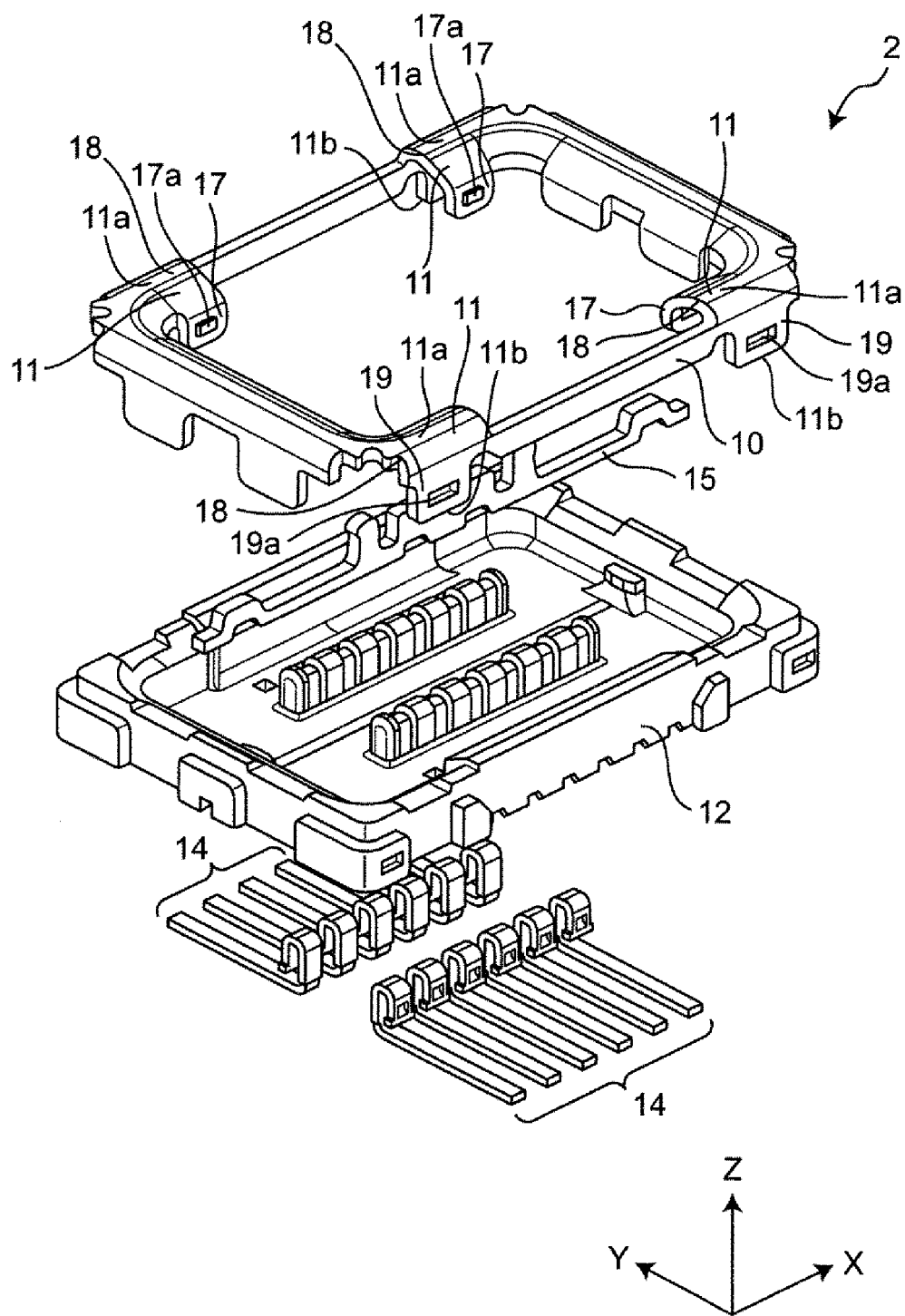
FIG. 3 is an exploded perspective view of a first connector of the electrical connector set illustrated in FIG. 1.

FIG. 3 is an exploded perspective view of the first connector 2 of the electrical connector set 1 illustrated in FIG. 1.

As illustrated in FIG. 1 to FIG. 3, the first connector 2 is, for example, a multipolar connector including a first external terminal 10, a plurality of first internal terminals 14, a first housing 12, and a first shield member 15.

Each of the first internal terminals 14 is a conductor to be connected to a signal potential or a ground potential. The first internal terminal 14 is formed in a predetermined shape by bending a conductive member having a rod shape. The first internal terminal 14 is made of an elastically deformable metal material (for example, phosphor bronze). Since the first internal terminal 14 illustrated in FIG. 3 as an example has, for example, a convex shape, the first internal terminal 14 is usually also referred to as a male-type multipolar connection terminal. The first internal terminal 14 is fitted and held in a groove of the first housing 12. When the first connector 2 and the second connector 4 are in a fitted state, the first internal terminal 14 contacts a second internal terminal 24 of the second connector 4, which will be described later. When the first internal terminal 14 contacts the second internal terminal 24, the first connector 2 and the second connector 4 are electrically connected to each other.

The first internal terminals 14 are arranged in a plurality of rows, and a plurality of first internal terminals 14 is arranged per row. In the example illustrated in FIG. 3, the first internal terminals 14 are arranged in two rows, and six first internal terminals 14 are arranged per row. For example, a longitudinal direction of the first connector 2, that is, a direction in which the plurality of first internal terminals 14 is arranged in a row, is defined as the X-axis direction. Further, a short length direction of the first connector 2, that is, an extending direction of the first internal terminal 14 is defined as the Y-axis direction. Note that the Y-axis direction is also an insertion/extraction orthogonal direction orthogonal to the connector insertion/extraction direction (Z-axis direction).

The first housing 12 is a member that integrally holds the first internal terminal 14 described above, the first external terminal 10, which will be described below, and the first shield member 15. The first housing 12 is made of a material having an electrical insulation property (for example, a resin material).

The first connector 2 is manufactured by, for example, performing insert molding of the first internal terminals 14, the first external terminal 10, and the first shield member 15 integrally with the first housing 12.

The first external terminal 10 is a conductor to be connected to a ground potential. The first external terminal 10 is made of an elastically deformable metal material (for example, phosphor bronze). The first external terminal 10 is electrically connected to the ground potential, thereby shielding electromagnetic waves from the outside of the first connector 2 and electromagnetically shielding the inside of the first connector 2. In particular, the first external terminal 10 prevents the first internal terminals 14 from receiving interference due to electromagnetic waves from the outside of the first connector 2. The first external terminal 10 is fitted and held in a groove around the first housing 12 so as to surround the first internal terminals 14.

The first shield member 15 is a conductive member for suppressing interference due to electromagnetic waves between the rows of the first internal terminals 14. The first shield member 15 is disposed between the rows of the first internal terminals 14, and is fitted and held in the groove of the first housing 12.

The first shield member 15 is not in direct contact with the first external terminal 10, but is electrically connected to the first external terminal 10 on the circuit board (not illustrated) to which the first connector 2 is connected. By this connection, the first shield member 15 is electrically connected to the ground potential integrally with the first external terminal 10. The first shield member 15 electrically connected to the ground potential constructs a shield against electromagnetic waves. The interference due to the electromagnetic waves between the rows of the first internal terminals 14 is suppressed by the first shield member 15.

[Second Connector]

Figure 4:
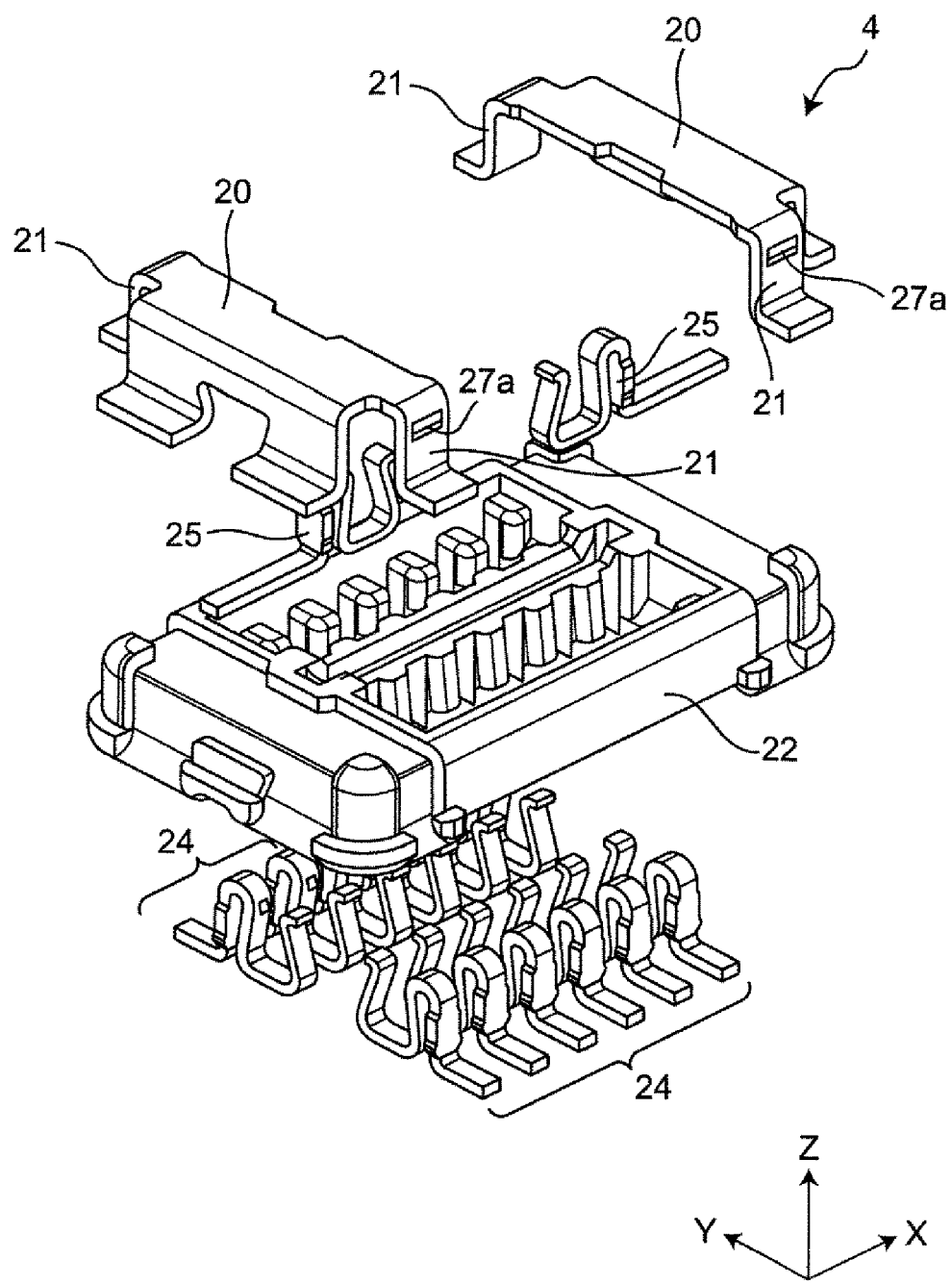
FIG. 4 is an exploded perspective view of a second connector of the electrical connector set illustrated in FIG. 1.

FIG. 4 is an exploded perspective view of the second connector 4 of the electrical connector set 1 illustrated in FIG. 1.

As illustrated in FIG. 1, FIG. 2, and FIG. 4, the second connector 4 is a multipolar connector including a second external terminal 20, a plurality of second internal terminals 24, a second housing 22, and a second shield member 25. Since each configuration of the second connector 4 is similar to each configuration of the first connector 2, description thereof will be appropriately omitted.

The second internal terminal 24 is a conductor in contact with the first internal terminal 14 of the first connector 2 described above, and is held by the second housing 22. Similarly to the first internal terminal 14, the second internal terminal 24 is formed in a predetermined shape by bending a member having a rod shape. The second internal terminal 24 is made of an elastically deformable metal material (for example, phosphor bronze). Since the second internal terminal 24 illustrated in FIG. 4 as an example has, for example, a concave shape, the second internal terminal 24 is usually also referred to as a female-type multipolar connection terminal.

Each of the second internal terminals 24 is provided corresponding one-to-one to each of the first internal terminals 14 of the first connector 2. Specifically, the second internal terminals 24 are also arranged in two rows, and six second internal terminals 24 are arranged per row. Each of the second internal terminals 24 corresponds one-to-one to each of the first internal terminals 14.

Similarly to the first housing 12 described above, the second housing 22 is a member that integrally holds the second internal terminals 24, the second external terminal 20, and the second shield member 25. The second housing 22 is made of a material having an electrical insulation property (for example, a resin material).

Similarly to the first external terminal 10 described above, the second external terminal 20 is a conductor to be connected to the ground potential in order to prevent the second internal terminals 24 from receiving interference due to electromagnetic waves outside the second connector 4. The second external terminal 20 is made of an elastically deformable metal material (for example, phosphor bronze).

The second external terminal is disposed so as to surround the second internal terminals 24.

Similarly to the first shield member 15 described above, the second shield member is a conductive member for suppressing interference due to electromagnetic waves between the rows of the second internal terminals 24. The second shield member 25 is configured as a member having a plate shape and extending in the X-axis direction in which the rows of the second internal terminals 24 are arranged. The second shield member 25 is electrically connected to the second external terminal 20 on the circuit board (not illustrated) on which the second connector 4 is mounted.

Similarly to the first connector 2, in the second connector 4 described above, interference due to electromagnetic waves from the outside is suppressed by the second external terminal 20, and interference due to electromagnetic waves between the rows of the second internal terminals 24 is suppressed by the second shield member 25.

[Fitting Structure of Electrical Connectors to Each Other]

The first external terminal 10 of the first connector 2 has a plurality of first fitting portions 11. The first external terminal 10 illustrated in FIG. 3 as an example includes two first fitting portions 11 facing each other in the longitudinal direction (X-axis direction) at one side, and two first fitting portions 11 facing each other in the longitudinal direction (X-axis direction) at the other side, that is, includes four first fitting portions 11 in total. Each first fitting portion 11 is disposed, for example, near a corner portion in the longitudinal direction (X-axis direction).

Figure 5:
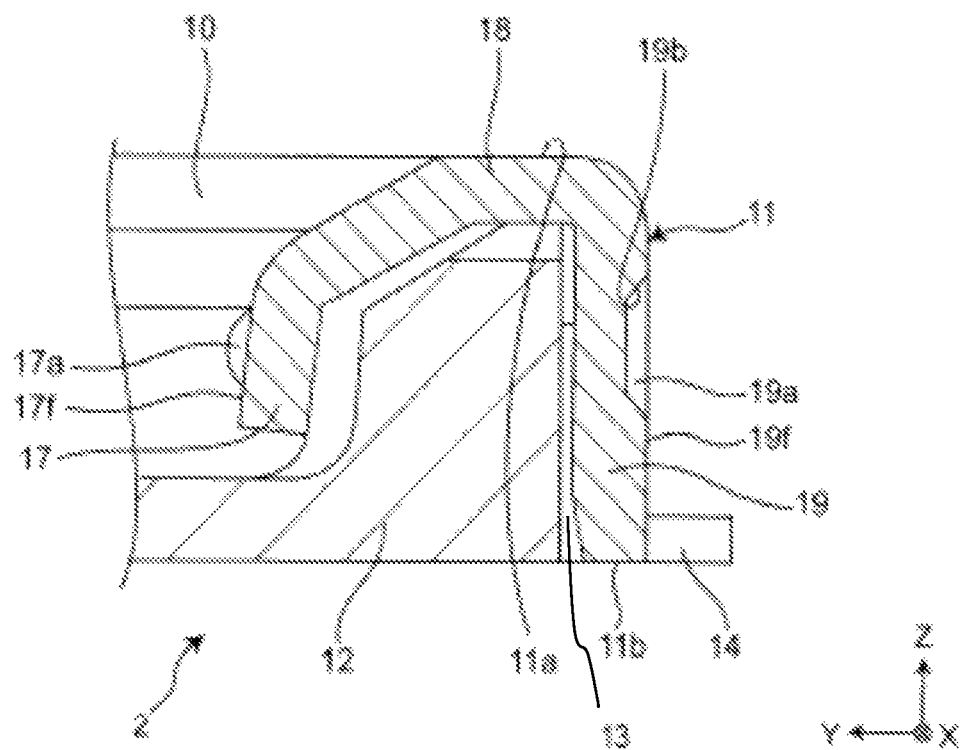
FIG. 5 is a cross-sectional view illustrating a fitting portion of the first connector.
Figure 6:
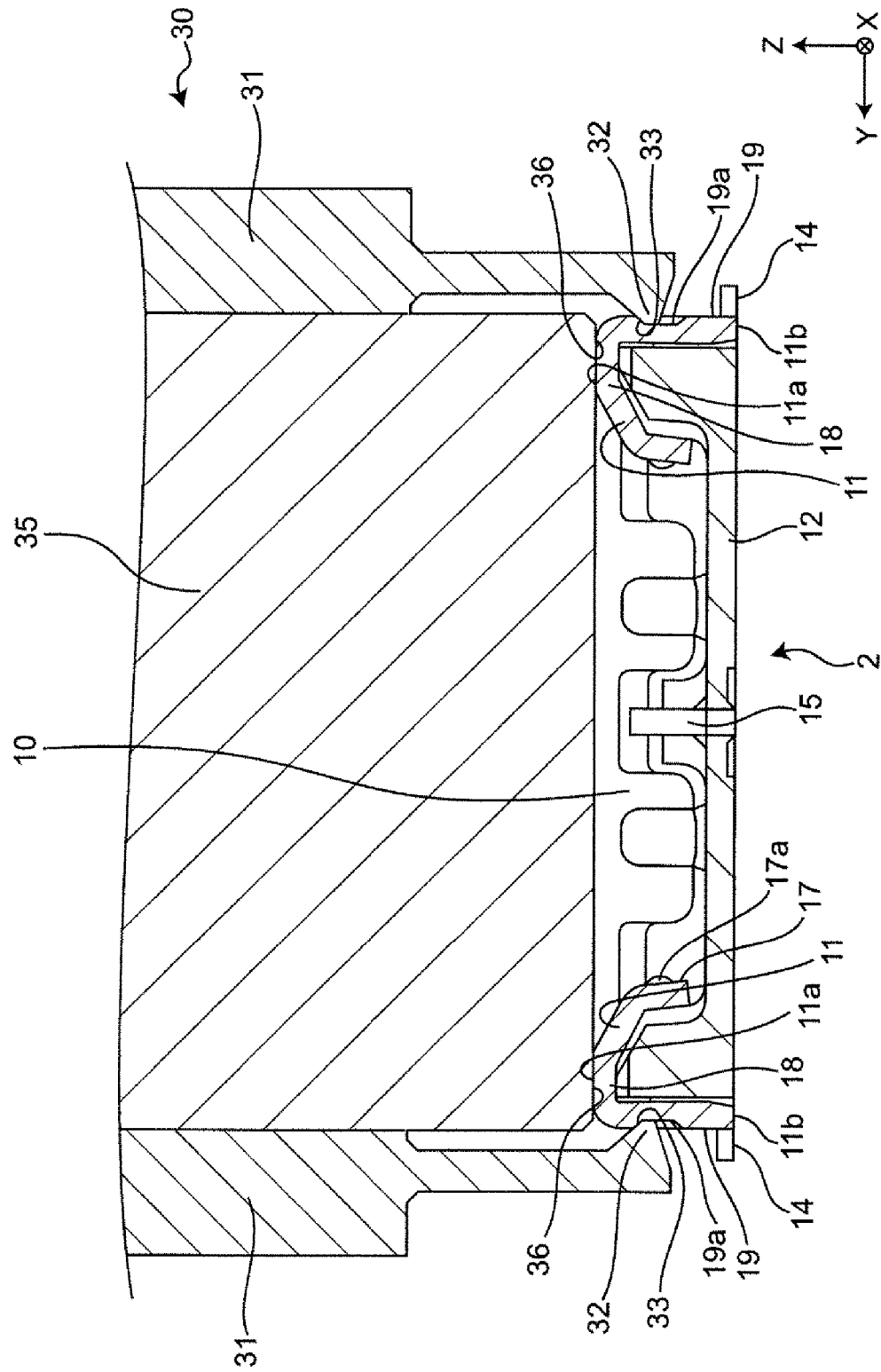
FIG. 6 is a cross-sectional view schematically illustrating a state in which the first connector is being inspected by an inspection device.

As illustrated in FIG. 5, each first fitting portion 11 of the first external terminal 10 is bent in an inverted U-shape in a cross-sectional view, and includes a first connector engagement wall portion 17, a connecting portion 18, and an engagement wall portion for inspection 19. The first fitting portion 11 has the first connector engagement wall portion 17 at one side (for example, at an inner side portion) and the engagement wall portion for inspection 19 at the other side (for example, at an outer side portion) in a plan view from the connector insertion/extraction direction (Z-axis direction). A gap 13 is formed between an inner side surface of the engagement wall portion for inspection 19 of the inverted U-shape and the first housing 12.

The first connector engagement wall portion 17 is positioned at one side (for example, at the inner side portion) of the first external terminal 10 (first fitting portion 11). The engagement wall portion for inspection 19 is positioned at the other side (for example, at the outer side portion) of the first external terminal 10 (first fitting portion 11). The connecting portion 18 connects an upper portion of the first connector engagement wall portion 17 and an upper portion of the engagement wall portion for inspection 19.

When the first connector 2 is mounted on the circuit board (not illustrated), the engagement wall portion for inspection 19 is fixed to and supported by a mounting portion (not illustrated) of the circuit board with a first mounting surface 11*b* positioned at a lower end of the engagement wall portion for inspection 19 interposed therebetween. That is, the first fitting portion 11 is elastically supported in a cantilever manner at the side of the engagement wall portion for inspection 19 at the time of mounting. An upper portion of the first connector engagement wall portion 17 is connected to the connecting portion 18, but a lower end of the first connector engagement wall portion 17 is a free end to which nothing is connected. Thus, the first connector engagement wall portion 17 is elastically supported in a cantilever manner as a free end portion. According to this configuration, a biasing force that biases the first connector engage-ment wall portion 17 of the first fitting portion 11 toward the second fitting portion 21 of the second connector 4 that is a fitting counterpart is applied, and thus, fitting between the first fitting portion 11 and the second fitting portion 21 is stabilized.

A first connector engagement portion 17*a* is formed at an inner side of the first connector 2, that is, at an inner side surface 17*f* of the first connector engagement wall portion 17 in a plan view from the connector insertion/extraction direction. The first connector engagement portion 17*a* is, for example, a protruding portion having a convex shape that protrudes toward the second fitting portion 21 of the second connector 4 that is a fitting counterpart (that is, in the insertion/extraction orthogonal direction (Y-axis direction)). This makes it easy to fit the second connector 4 that is the fitting counterpart to the second fitting portion 21.

As illustrated in FIG. 1 and FIG. 4, each second fitting portion 21 of the second external terminal 20 has a shape bent downward in a thickness direction (Z-axis direction) of the second connector 4. A second connector engagement portion 27*a* is formed at an outer side surface of the second fitting portion 21. The second connector engagement portion 27*a* has, for example, a concave shape recessed so as to be engageable with the first connector engagement portion 17*a* of the first fitting portion 11. The second connector engagement portion 27*a* is disposed at a position corresponding to the first connector engagement portion 17*a*. As described above, since a biasing force acts on the first connector engagement wall portion 17, when the second connector 4 is moved toward the first connector 2 (in the connector insertion direction), the first fitting portion 11 is stably fitted to the second fitting portion 21. When the first connector 2 and the second connector 4 are fitted to each other, the first connector engagement portion 17*a* having a convex shape is engaged with the second connector engagement portion 27*a* having a concave shape. As described above, since the first connector engagement wall portion 17 on which the first connector engagement portion 17*a* is formed is elastically supported in a cantilever manner, a biasing force acts on the first connector engagement portion 17*a*. As a result, the engagement of the first connector engagement portion 17*a* with the second connector engagement portion 27*a* that is an engagement counterpart of the first connector engagement portion 17*a* is stabilized.

[Fitting Structure Between First Connector and Inspection Device]

With reference to FIG. 6, FIG. 7, and FIGS. 8A-8C, a fitting structure between the first connector 2 and the inspection device will be described.

An inspection device 30 includes a probe (not illustrated), an engagement member for inspection 31, a ground contact member 35, and an inspection device main body (not illustrated). The probe is a conductor extending in a leg shape from the upper side to the lower side, and is electrically connected to the inspection device main body. The probe is brought into contact with and electrically connected to the first internal terminals 14 of the first connector 2, thereby inspecting the first connector 2.

The ground contact member 35 is a conductor to be connected to a ground potential. A ground contact surface 36 is formed at a lower surface of the ground contact member 35. The ground contact surface 36 is, for example, a flat surface. A first flat surface 11*a* is formed on an upper surface of the connecting portion 18 of the first fitting portion 11. The first flat surface 11*a* extends parallel to a surface perpendicular to the connector insertion/extraction direction (Z-axis direction). When the first connector 2 is inspected by using the inspection device 30, the ground contact surface 36 can contact the first flat surface 11a. That is, the first fitting portion 11 is formed with the first flat surface 11a that can be brought into contact with the ground contact member 35 of the inspection device 30. Thus, the ground contact member 35 and the first fitting portion 11 are electrically connected to each other. Thus, since the first fitting portion 11 and the ground contact member 35 are electrically connected to the ground potential, the inspection of the first connector 2 by the probe of the inspection device 30 is stabilized.

The engagement member for inspection 31 is an elastic member extending in a leg shape from the upper side to the lower side, and is made of, for example, a resin material having an electrical insulation property. An upper portion of the engagement member for inspection 31 is fixed to and supported by the inspection device main body, while a lower portion of the engagement member for inspection 31 is a free end to which nothing is connected. Thus, the engagement member for inspection 31 is elastically supported in a cantilever manner.

Figure 7:
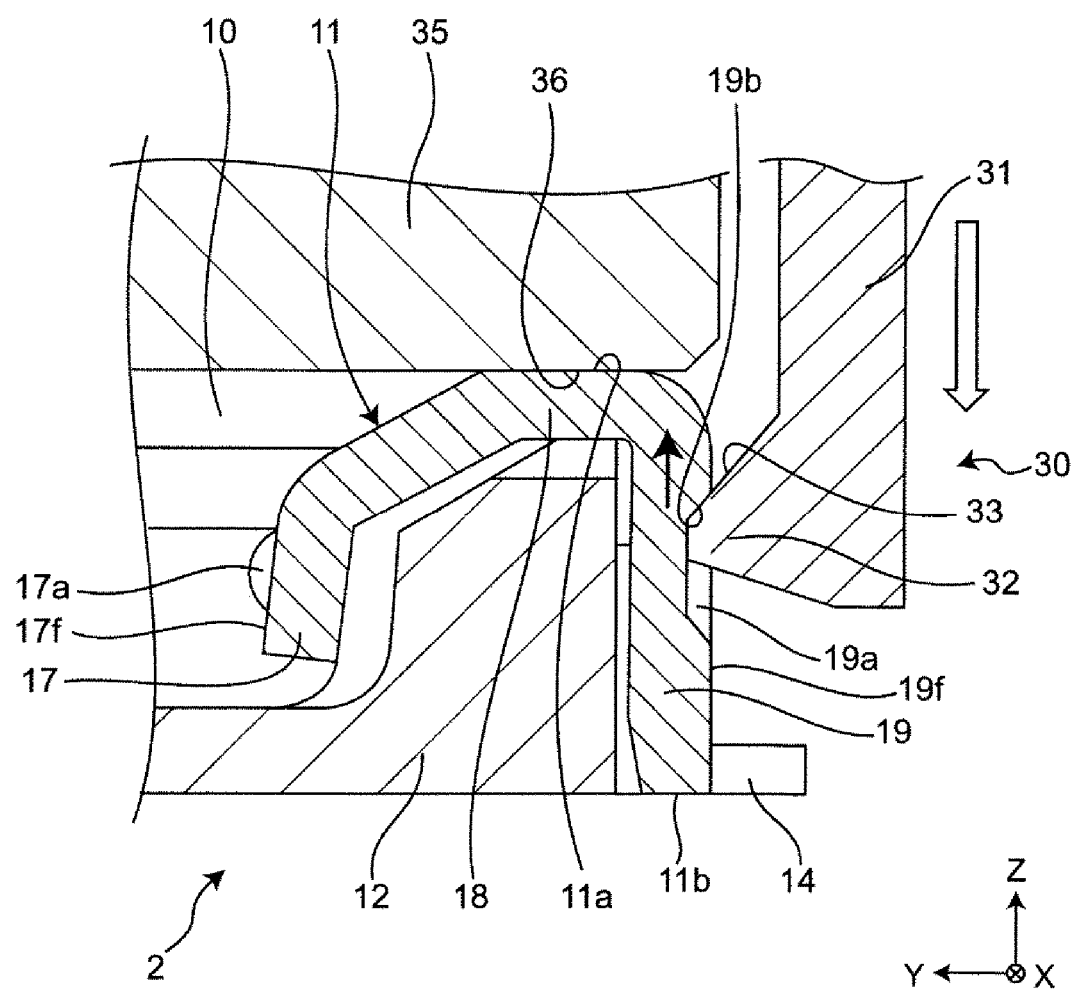
FIG. 7 is a cross-sectional view schematically illustrating a state in which the first connector and the inspection device are fitted to each other.

An external terminal engagement portion 32 is provided at the lower portion of the engagement member for inspection 31. The external terminal engagement portion 32 has, for example, a convex shape protruding toward the first fitting portion 11 facing the external terminal engagement portion 32 at the time of fitting. An external terminal engagement surface 33 is formed on the upper surface of the external terminal engagement portion 32. The external terminal engagement surface 33 is, for example, an inclined surface or a curved surface having a downward gradient toward the first fitting portion 11 facing the external terminal engagement surface 33 at the time of fitting. In FIG. 7, the external terminal engagement surface 33 is illustrated as an inclined surface having a downward gradient toward the first fitting portion 11.

Figure 8A:
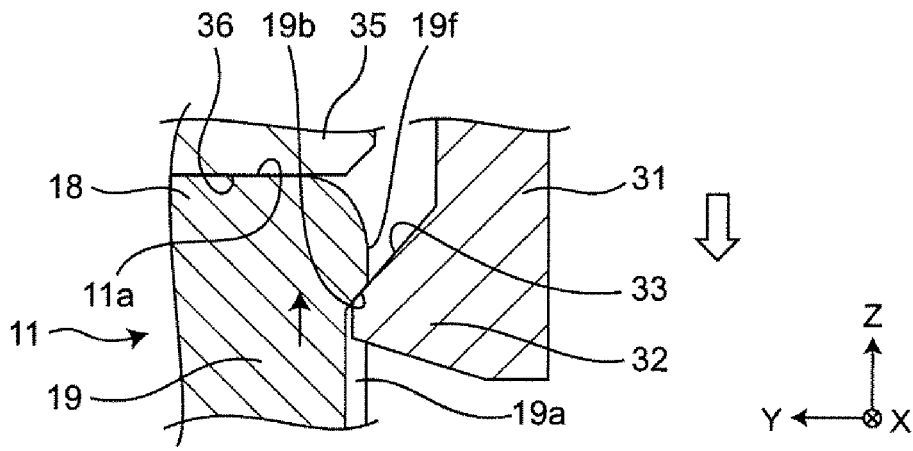
FIGS. 8A-8C are cross-sectional views illustrating a main portion in a state in which the first connector and the inspection device are fitted to each other, with FIG. 8A illustrating a fitted state in FIG. 7, FIG. 8B illustrating a fitting structure according to a first modified example, and FIG. 8C illustrating a fitting structure according to a second modified example.

In a plan view from the connector insertion/extraction direction, an engagement portion for inspection 19a is formed at the outer side portion of the first connector 2, that is, at an outer side surface 19f of the engagement wall portion for inspection 19 of the first fitting portion 11 (a surface on a side of the engagement member for inspection 31 facing the engagement wall portion for inspection 19 at the time of fitting). The engagement portion for inspection 19a is, for example, an engagement portion for engaging, with the first connector 2, the engagement member for inspection 31 of the inspection device 30 that inspects the first connector 2. However, the engagement portion for inspection 19a can also be used as a connector auxiliary engagement portion for compensating an engagement force of the connector engagement portion in fitting of the connectors to each other. The engagement portion for inspection 19a is a concave portion having a concave shape recessed with respect to the outer side surface 19f of the first external terminal 10 so as to be engageable with the external terminal engagement portion 32 of the engagement member for inspection 31. More specifically, as illustrated in FIG. 8A, the engagement portion for inspection 19a is a concave portion having a concave shape recessed with respect to the outer side surface 19f of the second engagement wall portion 19. In addition, the engagement portion for inspection 19a may be a through-hole penetrating through the second engagement wall portion 19. This facilitates fitting at the time of inspection.

An engagement surface for inspection 19b serving as the second engagement surface is formed on an upper surface of the engagement portion for inspection 19a. The engagement surface for inspection 19b is, for example, an inclined surface or a curved surface having an upward gradient toward the engagement member for inspection 31 facing the engagement surface for inspection 19b with respect to the first flat surface 11a at the time of fitting. In FIG. 7, the engagement surface for inspection 19b is illustrated as an inclined surface having an upward gradient toward the engagement member for inspection 31. Note that, in the first fitting portion 11, the engagement portion for inspection 19a and the first connector engagement portion 17a are positioned at substantially the same position in the connector insertion/extraction direction (Z-axis direction) and the longitudinal direction (X-axis direction).

When the inspection device 30 is moved toward the first connector 2 (in the connector insertion direction: in the direction of the void arrow in FIG. 7), the engagement member for inspection 31 of the inspection device 30 is fitted into the first fitting portion 11 of the first connector 2. When the engagement member for inspection 31 and the first fitting portion 11 are fitted to each other, the external terminal engagement portion 32 having a convex shape is engaged with the engagement portion for inspection 19a having a concave shape. At this time, as illustrated in FIG. 8A, the external terminal engagement surface 33 is engaged with the engagement surface for inspection 19b in a planar manner. According to this configuration, more reliable fitting between the inspection device 30 and the first connector 2 is achieved.

Since the external terminal engagement surface 33 is an inclined surface having a downward gradient and the engagement surface for inspection 19b is an inclined surface having an upward gradient, a force that directs the engagement wall portion for inspection 19 toward the inspection device 30 side is applied at the time of engagement. That is, an upward (the Z-axis direction: the direction of the black arrow in FIG. 7) biasing force with respect to the engagement portion for inspection 19a of the engagement wall portion for inspection 19 is applied. The upward force biases (pushes up) the engagement wall portion for inspection 19 toward the first flat surface 11a, that is, toward the ground contact member Thus, since the ground contact surface 36 and the first flat surface 11a come into close contact with each other, the first fitting portion 11 and the ground contact member 35 are stably electrically connected to the ground potential, and the inspection of the first connector 2 is stabilized.

As a result, since the connector engagement portion 17a and the engagement portion for inspection 19a are separately respectively formed at the one side and the other side of the fitting portion 11, the connector engagement portion 17a is not used at the time of inspection, so that the extraction force of the connector engagement portion 17a is not affected and stable inspection can be performed.

Further, since the fitting between the first connector 2 and the inspection device 30 is stable, it is possible to easily and reliably inspect the first connector 2 that is a multipolar connector.

Modified Example of Fitting Structure

A modified example of the fitting structure between the first connector 2 and the inspection device 30 will be described with reference to FIG. 8A through FIG. 9C, but description will focus on differences from the above-described embodiment.

Figure 8B:
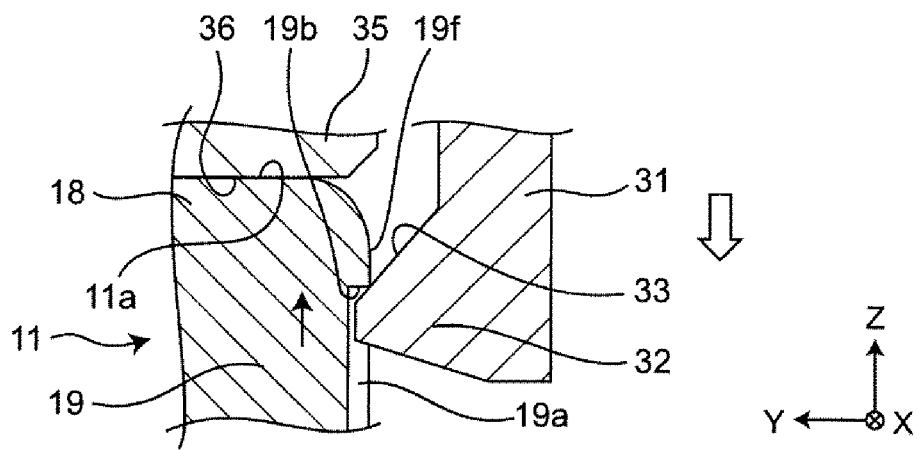

FIG. 8B illustrates a fitting structure according to a first modified example. In FIG. 8B, the external terminal engagement portion 32 has a convex shape protruding toward the first fitting portion 11 facing the external terminal engagement portion 32 at the time of fitting, and the external terminal engagement surface 33 is formed at the upper surface of the external terminal engagement portion 32. The external terminal engagement surface 33 is an inclined surface having a downward gradient toward the first fitting portion 11 facing the external terminal engagement surface 33 at the time of fitting.

On the other hand, at the outer side surface 19f of the engagement wall portion for inspection 19 of the first fitting portion 11 (the surface on the side of the engagement member for inspection 31 facing the engagement wall portion for inspection 19 at the time of fitting), the engagement portion for inspection 19a having a concave shape recessed so as to be engageable with the external terminal engagement portion 32 of the engagement member for inspection 31 is formed. An upper surface of the engagement portion for inspection 19a is formed with the engagement surface for inspection 19b extending toward the engagement member for inspection 31 in the short length direction (Y-axis direction, insertion/extraction orthogonal direction).

When the inspection device 30 is moved toward the first connector 2 (in the connector insertion direction: in the direction of the void arrow in the figure) and the engagement member for inspection 31 and the first fitting portion 11 are fitted to each other, the external terminal engagement portion 32 having the convex shape is engaged with the engagement portion for inspection 19a having the concave shape. At this time, a tip end portion of the engagement surface for inspection 19b is linearly engaged with the external terminal engagement surface 33 in the depth direction of the page (X-axis direction).

Since the external terminal engagement surface 33 is an inclined surface having a downward gradient, an upward force (in the direction of the black arrow in the figure) acts on the engagement portion for inspection 19a of the engagement wall portion for inspection 19 at the time of engagement. The upward force biases (pushes up) the engagement wall portion for inspection 19 toward the ground contact member 35. Thus, since the ground contact surface 36 and the first flat surface 11a come into close contact with each other, the first fitting portion 11 and the ground contact member 35 are stably electrically connected to the ground potential.

Figure 8C:
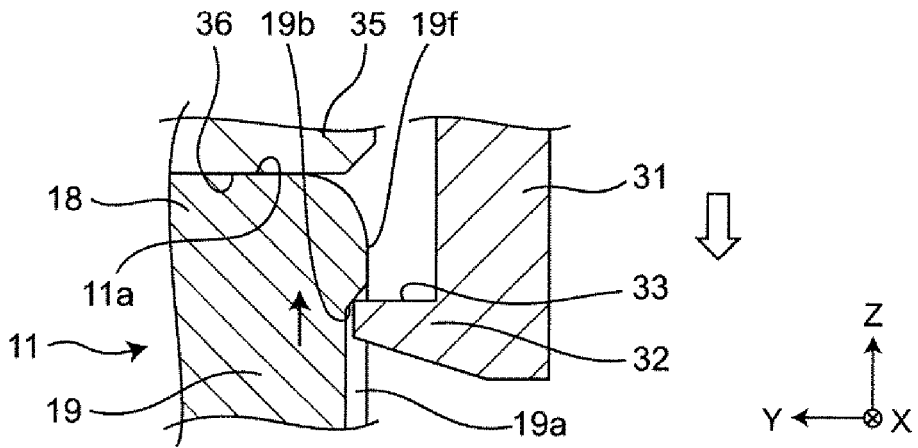

FIG. 8C illustrates a fitting structure according to a second modified example. In FIG. 8C, the external terminal engagement portion 32 has a convex shape protruding toward the first fitting portion 11 facing the external terminal engagement portion 32 at the time of fitting, and the external terminal engagement surface 33 extending in the short length direction (Y-axis direction, insertion/extraction orthogonal direction) toward the engagement wall portion for inspection 19 is formed on the upper surface of the external terminal engagement portion 32.

On the other hand, at the outer side surface 19f of the engagement wall portion for inspection 19 of the first fitting portion 11 (the surface on the side of the engagement member for inspection 31 facing the engagement wall portion for inspection 19 at the time of fitting), the engagement portion for inspection 19a having a concave shape recessed so as to be engageable with the external terminal engagement portion 32 of the engagement member for inspection 31 is formed. The upper surface of the engagement portion for inspection 19a is formed with the engagement surface for inspection 19b that is an inclined surface having an upward gradient toward the engagement member for inspection 31.

When the inspection device 30 is moved toward the first connector 2 (in the connector insertion direction: in the direction of the void arrow in the figure) and the engagement member for inspection 31 and the first fitting portion 11 are fitted to each other, the external terminal engagement portion 32 having the convex shape is engaged with the engagement portion for inspection 19a having the concave shape. At this time, the tip end portion of the external terminal engagement surface 33 is linearly engaged with the engagement surface for inspection 19b in the depth direction (X-axis direction) of the page).

Since the engagement surface for inspection 19b is an inclined surface having an upward gradient, an upward force (in the direction of the black arrow in the figure) acts on the engagement portion for inspection 19a of the engagement wall portion for inspection 19 at the time of engagement. The upward force biases (pushes up) the engagement wall portion for inspection 19 toward the ground contact member 35. Thus, since the ground contact surface 36 and the first flat surface 11a come into close contact with each other, the first fitting portion 11 and the ground contact member 35 are stably electrically connected to the ground potential.

Figure 9A:
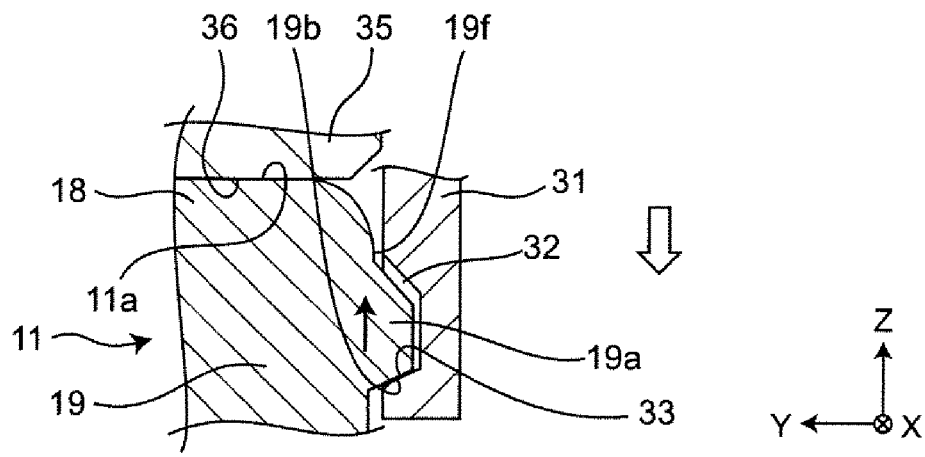
FIGS. 9A-9C are cross-sectional views illustrating a main portion in a state in which the first connector and the inspection device are fitted to each other, with FIG. 9A illustrating a fitting structure according to a third modified example, FIG. 9B illustrating a fitting structure according to a fourth modified example, and FIG. 9C illustrating a fitting structure according to a fifth modified example.

FIG. 9A illustrates a fitting structure according to a third modified example. In FIG. 9A, the external terminal engagement portion 32 having a concave shape recessed so as to be engageable with the engagement portion for inspection 19a of the engagement wall portion for inspection 19 is formed at the inner side surface of the lower portion of the engagement member for inspection 31 (the surface on the side of the engagement wall portion for inspection 19 facing the engagement member for inspection 31 at the time of fitting). The external terminal engagement surface 33 that is an inclined surface having a downward gradient toward the first fitting portion 11 is formed on the lower surface of the external terminal engagement portion 32.

On the other hand, at the outer side surface 19f of the engagement wall portion for inspection 19 of the first fitting portion 11 (the surface on the side of the engagement member for inspection 31 facing the engagement wall portion for inspection 19 at the time of fitting), the engagement portion for inspection 19a having a convex shape protruding toward the engagement member for inspection 31 facing the engagement wall portion for inspection 19 at the time of fitting is formed. On the lower surface of the engagement portion for inspection 19a, the engagement surface for inspection 19b that is an inclined surface having an upward gradient toward the engagement member for inspection 31 is formed.

When the inspection device 30 is moved toward the first connector 2 (in the connector insertion direction: in the direction of the void arrow in the figure) and the engagement member for inspection 31 and the first fitting portion 11 are fitted to each other, the engagement portion for inspection 19a having the convex portion is engaged with the external terminal engagement portion 32 having the concave shape. At this time, the engagement surface for inspection 19b is engaged with the external terminal engagement surface 33 in a planar manner.

Since the external terminal engagement surface 33 is an inclined surface having a downward gradient and the engagement surface for inspection 19b is an inclined surface having an upward gradient, a force that directs the engagement wall portion for inspection 19 toward the inspection device 30 side is applied at the time of engagement. That is, an upward force (in the direction of the black arrow in the figure) acts on the engagement portion for inspection 19a of the engagement wall portion for inspection 19. The upward force biases (pushes up) the engagement wall portion for inspection 19 toward the ground contact member 35. Thus, since the ground contact surface 36 and the first flat surface 11*a* come into close contact with each other, the first fitting portion 11 and the ground contact member 35 are stably electrically connected to the ground potential.

Figure 9B:
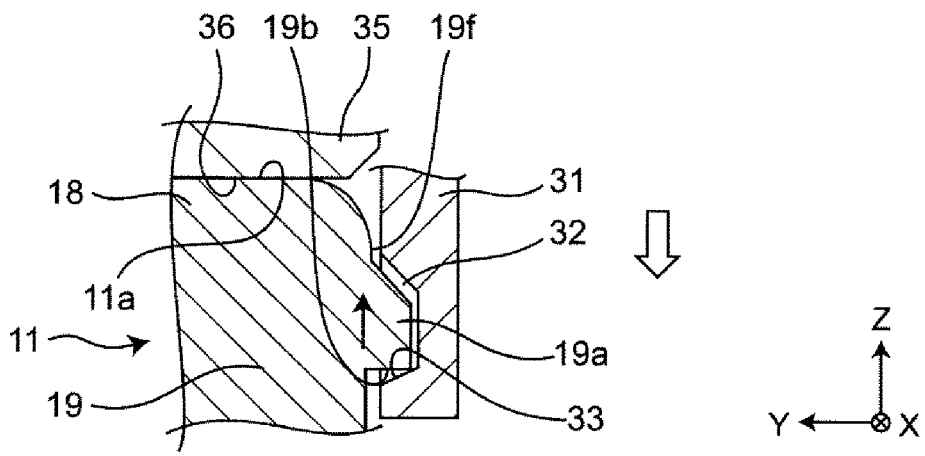

FIG. 9B illustrates a fitting structure according to a fourth modified example. In FIG. 9B, the external terminal engagement portion 32 having a concave shape recessed so as to be engageable with the engagement portion for inspection 19*a* of the engagement wall portion for inspection 19 is formed at the inner side surface of the lower portion of the engagement member for inspection 31 (the surface on the side of the engagement wall portion for inspection 19 facing the engagement member for inspection 31 at the time of fitting). The external terminal engagement surface 33 that is an inclined surface having a downward gradient toward the first fitting portion 11 is formed on the lower surface of the external terminal engagement portion 32.

On the other hand, at the outer side surface 19*f* of the engagement wall portion for inspection 19 of the first fitting portion 11 (the surface on the side of the engagement member for inspection 31 facing the engagement wall portion for inspection 19 at the time of fitting), the engagement portion for inspection 19*a* having a convex shape protruding toward the engagement member for inspection 31 facing the engagement wall portion for inspection 19 at the time of fitting is formed. On the lower surface of the engagement portion for inspection 19*a*, the engagement surface for inspection 19*b* extending in the short length direction (Y-axis direction, insertion/extraction orthogonal direction) toward the engagement member for inspection 31 is formed.

When the inspection device 30 is moved toward the first connector 2 (in the connector insertion/extraction direction: in the direction of the void arrow in the figure) and the engagement member for inspection 31 and the first fitting portion 11 are fitted to each other, the engagement portion for inspection 19*a* having the convex shape is engaged with the external terminal engagement portion 32 having the concave shape. At this time, a tip end portion of the engagement surface for inspection 19*b* is linearly engaged with the external terminal engagement surface 33 in the depth direction of the page (X-axis direction).

Since the external terminal engagement surface 33 is an inclined surface having a downward gradient, an upward force (in the direction of the black arrow in the figure) acts on the engagement portion for inspection 19*a* of the engagement wall portion for inspection 19 at the time of engagement. The upward force biases (pushes up) the engagement wall portion for inspection 19 toward the ground contact member 35. Thus, since the ground contact surface 36 and the first flat surface 11*a* come into close contact with each other, the first fitting portion 11 and the ground contact member 35 are stably electrically connected to the ground potential.

Figure 9C:
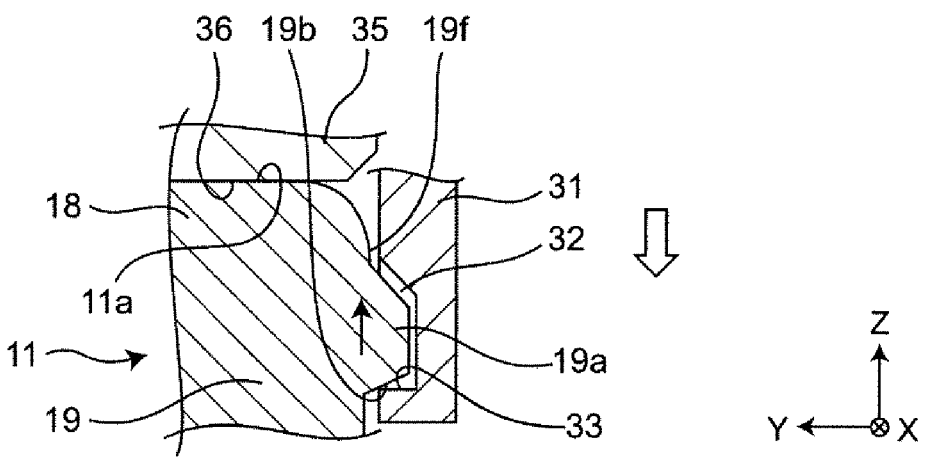

FIG. 9C illustrates a fitting structure according to a fifth modified example. In FIG. 9C, the external terminal engagement portion 32 having a concave shape recessed so as to be engageable with the engagement portion for inspection 19*a* of the engagement wall portion for inspection 19 is formed at the inner side surface of the lower portion of the engagement member for inspection 31 (the surface on the side of the engagement wall portion for inspection 19 facing the engagement member for inspection 31 at the time of fitting). The lower surface of the external terminal engagement portion 32 is formed with the external terminal engagement surface 33 extending in the short length direction (Y-axis direction, insertion/extraction orthogonal direction) toward the engagement wall portion for inspection 19.

On the other hand, at the outer side surface 19*f* of the engagement wall portion for inspection 19 of the first fitting portion 11 (the surface on the side of the engagement member for inspection 31 facing the engagement wall portion for inspection 19 at the time of fitting), the engagement portion for inspection 19*a* having a convex shape protruding toward the engagement member for inspection 31 facing the engagement wall portion for inspection 19 at the time of fitting is formed. On the lower surface of the engagement portion for inspection 19*a*, the engagement surface for inspection 19*b* that is an inclined surface having an upward gradient toward the engagement member for inspection 31 is formed.

When the inspection device 30 is moved toward the first connector 2 (in the connector insertion/extraction direction: in the direction of the void arrow in the figure) and the engagement member for inspection 31 and the first fitting portion 11 are fitted to each other, the engagement portion for inspection 19*a* having the convex shape is engaged with the external terminal engagement portion 32 having the concave shape. At this time, the tip end portion of the external terminal engagement surface 33 is linearly engaged with the engagement surface for inspection 19*b* in the depth direction (X-axis direction) of the page.

Since the engagement surface for inspection 19*b* is an inclined surface having an upward gradient, an upward force (in the direction of the black arrow in the figure) acts on the engagement portion for inspection 19*a* of the engagement wall portion for inspection 19 at the time of engagement. The upward force biases (pushes up) the engagement wall portion for inspection 19 toward the ground contact member 35. Thus, since the ground contact surface 36 and the first flat surface 11*a* come into close contact with each other, the first fitting portion 11 and the ground contact member 35 are stably electrically connected to the ground potential.

As described above, at least one of the engagement surface for inspection 19*b* of the engagement portion for inspection 19*a* and the external terminal engagement surface 33 of the external terminal engagement portion 32 is configured such that a force that directs the engagement wall portion for inspection 19 toward the inspection device 30 is applied. According to this configuration, since the ground contact surface 36 and the first flat surface 11*a* come into close contact with each other, the first fitting portion 11 and the ground contact member 35 are stably electrically connected to the ground potential, and the inspection of the first connector 2 is stabilized.

[Method of Inspecting Electrical Connector]

A method of inspecting the first connector 2 by using the inspection device 30 will be described with reference to FIG. 10.

Figure 10:
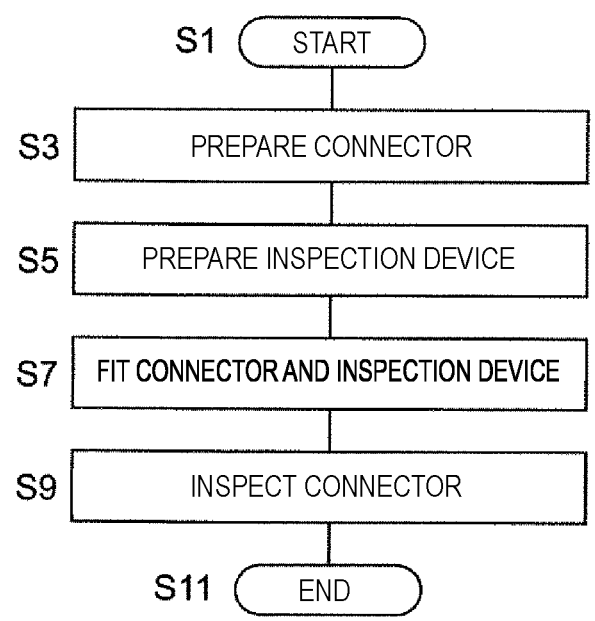
FIG. 10 is a flowchart illustrating an example of a method of inspecting the electrical connector by using the inspection device.

FIG. 10 is a flowchart illustrating an example of a method of inspecting the first connector 2 by using the inspection device 30. In step S1, the inspection of the first connector 2 by using the inspection device 30 is started.

In step S3, the first connector 2 is prepared. As described above, the first connector 2 includes the first housing 12 having an electrical insulation property, the first internal terminals 14 held by the first housing 12, and the first external terminal 10 held by the first housing 12, the external terminal 10 to be electrically connected to a ground, the first external terminal 10 includes the first fitting portion 11 having the first connector engagement wall portion 17 at one side and having the engagement wall portion for inspection 19 at the other side in a plan view from the connector insertion/extraction direction (Z-axis direction), and the first connector engagement portion 17a is formed at the inner side surface 17f of the first connector engagement wall portion 17, and the engagement portion for inspection 19a is formed at the outer side surface 19f of the engagement wall portion for inspection 19.

In step S5, the inspection device 30 is prepared. As described above, the inspection device 30 includes the probe, the engagement member for inspection 31, the ground contact member 35, and the inspection device main body, and the engagement member for inspection 31 has the external terminal engagement portion 32 that is engaged with the engagement portion for inspection 19a.

In step S7, the inspection device 30 is fitted to the first connector 2. That is, the inspection device 30 is moved toward the first connector 2 (in the connector insertion direction), and the engagement member for inspection 31 of the inspection device 30 is fitted to the first fitting portion 11 of the first connector 2. The engagement member for inspection 31 and the first fitting portion 11 are fitted to each other, and the external terminal engagement portion 32 is engaged with the engagement portion for inspection 19a.

In step S9, the first connector 2 is inspected by using the inspection device 30 while maintaining the fitted state. That is, the probe of the inspection device 30 is brought into contact with and electrically connected to the first internal terminals 14 of the first connector 2, thereby inspecting the first connector 2.

In step S11, the inspection of the first connector 2 is completed by releasing the fitting of the inspection device 30 to the first connector 2. That is, the fitting of the inspection device 30 to the first connector 2 is released, and the inspection device 30 is moved in the direction opposite to the first connector 2 (connector extraction direction), thereby completing the inspection of the first connector 2.

Although the specific embodiment of the present disclosure has been described, the present disclosure is not limited to the above-described embodiment, and various modifications can be made within the scope of the present disclosure.

For example, in the first fitting portion 11 of the first external terminal 10, a configuration may be adopted in which the first connector engagement wall portion 17 having the first connector engagement portion 17a is provided at the outer side portion of the first fitting portion 11, and the engagement wall portion for inspection 19 having the engagement portion for inspection 19a is provided at the inner side portion of the first fitting portion 11. In this case, the second connector 4 is fitted at the outer side portion of the first connector 2, and the engagement member for inspection 31 of the inspection device 30 is fitted at the inner side portion of the first connector 2.

A configuration may be adopted in which the first connector engagement portion 17a has a concave shape and the second connector engagement portion 27a has a convex shape, and the first connector engagement portion 17a having the concave shape and the second connector engagement portion 27a having the convex shape are engaged with each other in the fitted state of the first connector 2 and the second connector 4.

Also in the second connector 4, similarly to the first connector 2, a configuration may be adopted in which the second fitting portion 21 of the second external terminal 20 is bent in an inverted U-shape in a cross-sectional view, and includes a second connector engagement wall portion, an engagement wall portion for inspection, and a connecting portion. Thus, also for the second connector 4, similarly to the first connector 2, it is possible to perform stable inspection by using the inspection device 30 without affecting an extraction force of the second connector engagement portion 27a.

The engagement member for inspection 31 of the inspection device 30 may be made of an elastic conductive material (for example, a metal material). A configuration may be adopted in which the engagement member for inspection 31 is integrated with the ground contact member 35 and is electrically connected to the ground potential between the first fitting portion 11 and the engagement member for inspection 31.

In the method of inspecting the first connector 2 by using the inspection device 30, preparing the inspection device 30 may be performed first, and then preparing the first connector 2 may be performed.

The first external terminal 10 may have a configuration in which the first connector engagement wall portion 17 formed with the first connector engagement portion 17a is provided at the outer side surface 19f and the engagement wall portion for inspection 19 formed with the engagement portion for inspection 19a is provided at the inner side surface 17f in a plan view from the connector insertion/extraction direction (Z-axis direction). In this case, even when electronic components or the like are densely provided around the first connector 2, the engagement member for inspection 31 of the inspection device 30 is prevented from interfering with the electronic components or the like, thereby enabling smooth inspection.

The present disclosure and embodiment are summarized as follows.

An electrical connector 2 according to one aspect of the present disclosure includes a housing 12 having an electrical insulation property, an internal terminal 14 held by the housing 12, and an external terminal 10 held by the housing 12, the external terminal 10 to be electrically connected to a ground, The external terminal 10 includes a fitting portion 11 having a first engagement wall portion 17 at one side and having a second engagement wall portion 19 at the other side in a plan view from a connector insertion/extraction direction. A first engagement portion 17a is formed at the first engagement wall portion 17, and a second engagement portion 19a is formed at the second engagement wall portion 19.

According to the above-described configuration, since the first engagement portion 17a and the second engagement portion 19a are respectively separately formed at one side and the other side of the fitting portion 11, an extraction force of the first engagement portion 17a is not affected, and stable inspection can be performed.

Further, in the electrical connector 2 according to the embodiment, the first engagement wall portion is a connector engagement wall portion 17, the first engagement portion is a connector engagement portion 17a, the second engagement wall portion is an engagement wall portion for inspection 19, and the second engagement portion is an engagement portion for inspection 19a.

According to the above-described embodiment, since the connector engagement portion 17a and the engagement portion for inspection 19a are respectively separately formed at one side and the other side of the fitting portion 11, stable inspection can be performed without affecting the extraction force of the connector engagement portion 17a.

Further, in the electrical connector 2 according to the embodiment, when the electrical connector 2 is mounted on a circuit board, the engagement wall portion for inspection 19 is fixed to and supported by the circuit board, and the first engagement wall portion 17 is elastically supported as a free end portion.

According to the above-described embodiment, since a biasing force that biases the first engagement wall portion 17 of the fitting portion 11 toward a fitting portion of an electrical connector serving as a fitting counterpart is applied, fitting between the fitting portion 11 and the fitting portion is stabilized.

Further, in the electrical connector 2 according to the embodiment, the fitting portion 11 is provided with a flat surface 11a.

According to the above-described embodiment, since a contact area on the flat surface 11a is increased, the inspection of the electrical connector 2 is stabilized.

Further, in the electrical connector 2 according to the embodiment, the engagement portion for inspection 19a has an engagement surface for inspection 19b inclined with respect to the flat surface 11a, and the inclined engagement surface for inspection 19b is inclined so as to apply a biasing force in a direction of the flat surface 11a at a time of inspection.

According to the above-described embodiment, since the flat surface 11a is biased in a contact direction, the inspection of the electrical connector 2 is stabilized.

Further, in the electrical connector 2 according to the embodiment, the connector engagement portion 17a is arranged at an inner side portion of the electrical connector 2, and the engagement portion for inspection 19a is arranged at an outer side portion of the electrical connector 2 in a plan view from the connector insertion/extraction direction.

According to the above-described embodiment, since the engagement portion for inspection 19a is positioned at an outer side portion of the fitting portion 11, fitting at the time of inspection is facilitated.

Further, in the electrical connector 2 according to the embodiment, in the fitting portion 11, the engagement portion for inspection 19a is a concave portion or a through-hole formed at the outer side portion of the electrical connector 2.

According to the above-described embodiment, fitting at the time of inspection is facilitated.

Further, in the electrical connector 2 according to the embodiment, the electrical connector 2 is a multipolar connector in which a plurality of the internal terminals 14 is arranged.

According to the above embodiment, since fitting to the multipolar connector is stable at the time of inspection, the inspection of the multipolar connector can be easily and reliably performed.

An electrical connector 2 according to another aspect of the present disclosure includes a housing 12 having an electrical insulation property, an internal terminal 14 held by the housing 12, and an external terminal 10 held by the housing 12, with the external terminal 10 to be electrically connected to a ground. The external terminal 10 has an inner side surface 17f positioned at a side facing the internal terminal 14, an outer side surface 19f positioned at an opposite side to the inner side surface 17f in an insertion/extraction orthogonal direction orthogonal to a connector insertion/extraction direction, a first engagement portion 17a formed at the inner side surface 17f, and a second engagement portion 19a formed at the outer side surface 19f.

According to the above-described configuration, since the first engagement portion 17a and the second engagement portion 19a are respectively separately formed at the inner side surface 17f and the outer side surface 19f of the external terminal 10, an extraction force of the first engagement portion 17a is not affected, and stable inspection can be performed.

Further, in the electrical connector 2 according to the embodiment, the first engagement portion 17a is a connector engagement portion 17a, and the second engagement portion 19a is an engagement portion for inspection 19a.

According to the above-described embodiment, since the connector engagement portion 17a and the engagement portion for inspection 19a are respectively separately formed at the inner side surface 17f and the outer side surface 19f of the external terminal 10, the inspection can be stably performed without being affected by the extraction force of the connector engagement portion 17a.

In addition, in the electrical connector 2 according to the embodiment, the first engagement portion 17a is a protruding portion that protrudes from the inner side surface 17f in the insertion/extraction orthogonal direction.

According to the above-described embodiment, fitting to a fitting counterpart is facilitated.

Further, in the electrical connector 2 according to the embodiment, the first engagement portion 17a is supported by the inner side surface 17f of the external terminal such that a biasing force acts on the first engagement portion 17a.

According to the above embodiment, the engagement of the first connector engagement portion 17a with an engagement counterpart is stabilized.

In addition, in the electrical connector 2 according to the embodiment, the second engagement portion 19a is a concave portion or a through-hole formed at the outer side surface 19f.

According to the above-described embodiment, fitting at the time of inspection is facilitated.

A method of inspecting an electrical connector 2 according to an aspect of the present disclosure includes a connector preparation process of preparing the electrical connector 2 described above, an inspection device preparation process of preparing an inspection device having an external terminal engagement portion 32 to be engaged with the second engagement portion 19a, and an inspection process of inspecting the electrical connector 2 by using the inspection device 30 in a state where the external terminal engagement portion 32 is engaged with the second engagement portion 19a.

According to the above-described embodiment, since the first engagement portion 17a and the second engagement portion 19a are respectively separately formed at one side and the other side of the fitting portion 11, an extraction force of the first engagement portion 17a is not affected, and stable inspection can be performed.

Further, in the method of inspecting the electrical connector 2 according to the embodiment, in the inspection process, a flat surface 11a of the fitting portion 11 comes into contact with a ground contact surface 36 provided on a ground contact member 35 of the inspection device 30.

According to the above-described embodiment, since the fitting portion 11 and the ground contact member 35 are electrically connected to a ground, the inspection of the electrical connector 2 by the inspection device 30 is stabilized.

Further, in the method of inspecting the electrical connector 2 according to the embodiment, in the inspection process, an external terminal engagement surface 33 of the external terminal engagement portion 32 is engaged with a second engagement surface 19b of the second engagement portion 19a, and thus, a force that directs the fitting portion 11 toward the inspection device 30 is generated.

According to the above-described embodiment, since the flat surface 11a is stably electrically connected to the ground, the inspection of the electrical connector 2 is stabilized.

What is claimed is:

1. An electrical connector comprising:
a housing having an electrical insulation property;
an internal terminal held by the housing; and
an external terminal held by the housing, the external terminal being configured to electrically connect to a ground, wherein
the external terminal includes a fitting portion having a first engagement wall portion at one side and having a second engagement wall portion at the other side in a plan view from a connector insertion/extraction direction,
the fitting portion has a shape bent in a U-shape in a cross-sectional view, and
a first engagement portion, formed on an inner side surface of a first leg of the U-shape and configured to engage with a second connector, is at the first engagement wall portion, and a second engagement portion, formed on an outer side surface of a second leg of the U-shape, is at the second engagement wall portion,
wherein a gap is formed between an inner side surface of the second leg of the U-shape and the housing,
the second engagement portion is a concave portion or a through-hole formed at the outer side surface of the second leg of the U-shape, and
the second engagement portion is open when the inner side surface of the first leg of the U-shape is engaged with the second connector.

2. The electrical connector according to claim 1, wherein
the first engagement wall portion is a connector engagement wall portion,
the first engagement portion is a connector engagement portion,
the second engagement wall portion is an engagement wall portion for inspection, and
the second engagement portion is an engagement portion for inspection.

3. The electrical connector according to claim 2, wherein
when the electrical connector is mounted on a circuit board, the engagement wall portion for inspection is fixed to and supported by the circuit board, and the connector engagement wall portion is elastically supported as a free end portion.

4. The electrical connector according to claim 3, wherein
the fitting portion is provided with a flat surface extending parallel to a surface perpendicular to the connector insertion/extraction direction.

5. The electrical connector according to claim 4, wherein
the engagement portion for inspection has an engagement surface for inspection inclined with respect to the flat surface, and
the engagement surface for inspection is inclined in such a manner that a biasing force is applied in a direction of the flat surface at a time of inspection.

6. The electrical connector according to claim 2, wherein
the connector engagement portion is disposed at an inner side portion of the electrical connector and the engagement portion for inspection is disposed at an outer side portion of the electrical connector in a plan view from the connector insertion/extraction direction.

7. The electrical connector according to claim 2, wherein
in the fitting portion, the engagement portion for inspection is a concave portion or a through-hole at an outer side portion of the electrical connector.

8. The electrical connector according to claim 1, wherein
the electrical connector is a multipolar connector in which a plurality of the internal terminals is arranged.

9. The electrical connector according to claim 2, wherein
the electrical connector is a multipolar connector in which a plurality of the internal terminals is arranged.

10. The electrical connector according to claim 1, wherein
an inner side surface of the second leg of the U-shape is flat.

11. An electrical connector comprising:
a housing having an electrical insulation property;
an internal terminal held by the housing; and
an external terminal held by the housing, the external terminal being configured to electrically connect to a ground, wherein
the external terminal has an inner side surface positioned at a side facing the internal terminal, an outer side surface positioned at an opposite side to the inner side surface in an insertion/extraction orthogonal direction orthogonal to a connector insertion/extraction direction,
the external terminal includes a fitting portion having a shape bent in a U-shape in a cross-sectional view, a first engagement portion at the inner side surface formed on an inner side surface of a first leg of the U-shape, and a second engagement portion at the outer side surface formed on an outer side surface of a second leg of the U-shape,
a gap is formed between an inner side surface of the second leg of the U-shape and the housing,
the second engagement portion is a concave portion or a through-hole formed at the outer side surface of the second leg of the U-shape, and
the second engagement portion is open when the inner side surface of the first leg of the U-shape is engaged with a second connector.

12. The electrical connector according to claim 11, wherein
the first engagement portion is a connector engagement portion, and the second engagement portion is an engagement portion for inspection.

13. The electrical connector according to claim 11, wherein
the first engagement portion is a protruding portion that protrudes from the inner side surface of the first leg of the U-shape in the insertion/extraction orthogonal direction.

14. The electrical connector according to claim 11, wherein
the first engagement portion is supported by the inner side surface of the external terminal such that a biasing force acts on the first engagement portion.

15. The electrical connector according to claim 11, wherein
the second engagement portion is a concave portion or a through-hole formed at the outer side surface of the second leg of the U-shape.

16. A method of inspecting an electrical connector, the method comprising:
a connector preparation process of preparing the electrical connector according to claim 11;

an inspection device preparation process of preparing an inspection device having an external terminal engagement portion to be engaged with the second engagement portion; and an inspection process of inspecting the electrical connector by using the inspection device in a state where the external terminal engagement portion is engaged with the second engagement portion.

17. A method of inspecting an electrical connector, the method comprising:
   a connector preparation process of preparing the electrical connector, the electrical connector including:
   a housing having an electrical insulation property;
   an internal terminal held by the housing; and
   an external terminal held by the housing, the external terminal being configured to electrically connect to a ground, wherein
   the external terminal includes a fitting portion having a first engagement wall portion at one side and having a second engagement wall portion at the other side in a plan view from a connector insertion/extraction direction,
   the fitting portion has a shape bent in a U-shape in a cross-sectional view, and
   a first engagement portion, configured to engage with a counterpart connector, is at the first engagement wall portion, and a second engagement portion, configured to engage with the counterpart connector for inspection, is at the second engagement wall portion;
   an inspection device preparation process of preparing an inspection device having an external terminal engagement portion to be engaged with the second engagement portion; and
   an inspection process of inspecting the electrical connector by using the inspection device in a state where the external terminal engagement portion is engaged with the second engagement portion,
   wherein in the inspection process, a flat surface of the external terminal comes into contact with a ground contact surface provided on a ground contact member of the inspection device, and
   in the inspection process, an external terminal engagement surface of the external terminal engagement portion is engaged with a second engagement surface of the second engagement portion, and thus, a force that directs the flat surface toward the inspection device is generated.

* * * * *